US00RE50924E

(19) United States
(12) Reissued Patent
Aurola

(10) Patent Number: US RE50,924 E
(45) **Date of Reissued Patent: *Jun. 16, 2026**

(54) SEMICONDUCTOR RADIATION DETECTOR

(71) Applicant: Artto Aurola, Espoo (FI)

(72) Inventor: Artto Aurola, Espoo (FI)

( * ) Notice: This patent is subject to a terminal disclaimer.

(21) Appl. No.: 18/239,645

(22) Filed: Aug. 29, 2023

Related U.S. Patent Documents

Reissue of:
(64) Patent No.: 10,079,325
Issued: Sep. 18, 2018
Appl. No.: 15/033,743
PCT Filed: Nov. 4, 2014
PCT No.: PCT/FI2014/050826
§ 371 (c)(1),
(2) Date: May 2, 2016
PCT Pub. No.: WO2015/063375
PCT Pub. Date: May 7, 2015

U.S. Applications:
(63) Continuation of application No. 17/022,935, filed on Sep. 16, 2020, now Pat. No. Re. 49,704, which is an application for the reissue of Pat. No. 10,079,325.

(30) Foreign Application Priority Data

Nov. 4, 2013 (FI) ..... 20130320
Nov. 22, 2013 (FI) ..... 20136170

(51) Int. Cl.
*H01L 31/11* (2006.01)
*H01L 27/14* (2006.01)
(Continued)

(52) U.S. Cl.
CPC ..... *H10F 30/282* (2025.01); *H10F 39/8033* (2025.01); *H10F 39/80377* (2025.01)

(58) Field of Classification Search
CPC ..... H01L 27/14616; H01L 27/1461; H01L 31/1136
See application file for complete search history.

(56) References Cited

U.S. PATENT DOCUMENTS 7,816,653 B2 10/2010 Aurola
8,148,760 B2 4/2012 Aurola
(Continued)

FOREIGN PATENT DOCUMENTS

CN 101015063 A 8/2007
CN 101356646 A 1/2009
(Continued)

OTHER PUBLICATIONS

Chinese Office Action dated Apr. 28, 2018 in corresponding Chinese Patent Application No. 201480068356.7 with English translation of Chinese Office Action.
(Continued)

*Primary Examiner* — Leonardo Andujar
(74) *Attorney, Agent, or Firm* — NIXON & VANDERHYE

(57) ABSTRACT

A semiconductor radiation detector device includes a semiconductor substrate. On one surface of the substrate are a MIG layer (241) of semiconductor of second conductivity type, a barrier layer (251) of semiconductor of first conductivity type, and pixel dopings of semiconductor of the second conductivity type. The pixel dopings are adapted to be coupled to at least one pixel voltage in order to create a source and a drain of a pixel-specific transistor. The device further includes a first conductivity type first contact, so that the pixel voltage is a potential difference between one of the pixel dopings and the first conductivity type first contact. The location of a main gate (983) corresponds at least partly to the location of a channel between the source and the drain. The device includes at least one extra gate (981, 982) horizontally displaced from the main gate (983).

12 Claims, 9 Drawing Sheets

(51) Int. Cl.

| | |
|---|---|
| ***H01L 27/146*** | (2006.01) |
| ***H01L 31/113*** | (2006.01) |
| ***H10F 30/282*** | (2025.01) |
| ***H10F 39/00*** | (2025.01) |

(56) References Cited

U.S. PATENT DOCUMENTS

| | | | | |
|---|---|---|---|---|
| 8,288,837 | B2 | 10/2012 | Aurola | |
| 2001/0054723 | A1* | 12/2001 | Narui | H01L 27/1463 257/228 |
| 2003/0223053 | A1 | 12/2003 | Liu et al. | |
| 2007/0176213 | A1 | 8/2007 | Oda | |
| 2008/0315265 | A1 | 12/2008 | Aurola | |
| 2009/0001435 | A1 | 1/2009 | Aurola | H10F 39/107 257/292 |
| 2009/0134396 | A1 | 5/2009 | Kawahito et al. | |
| 2009/0153708 | A1 | 6/2009 | Hirota et al. | |
| 2009/0284731 | A1 | 11/2009 | Jin et al. | |
| 2010/0133441 | A1* | 6/2010 | Aurola | H10F 39/151 250/370.14 |
| 2012/0092536 | A1 | 4/2012 | Hirota | |
| 2013/0016263 | A1 | 1/2013 | Sato et al. | |

FOREIGN PATENT DOCUMENTS

| | | | |
|---|---|---|---|
| CN | 101356654 | A | 1/2009 |
| JP | 2004274009 | A | 9/2004 |
| JP | 2007103578 | A | 4/2007 |
| JP | 2008511132 | A | 4/2008 |
| JP | 2009522821 | A | 6/2009 |
| JP | 2009152234 | A | 7/2009 |
| JP | 2011004370 | A | 1/2011 |
| JP | 2012190951 | A | 10/2012 |
| WO | 2007/077286 | A1 | 7/2007 |

OTHER PUBLICATIONS

Japanese Office Action dated Jul. 3, 2018 in corresponding Japanese Patent Application No. 2016-551053 with JPO machine translation of Japanese Office Action.

Office Action issued in Japanese Patent Application No. 2022-080294, dated Aug. 1, 2023.

International Search Report, dated May 7, 2015, from Corresponding PCT Application.

Finnish Search Report, dated Jun. 26, 2014, from Corresponding Finnish Application.

* cited by examiner

SEMICONDUCTOR RADIATION DETECTOR

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a continuation of reissue application Ser. No. 17/022,935 filed Sep. 16, 2020, now RE49,704, which is a reissue of U.S. Pat. No. 10,079,325, filed Nov. 4, 2014, which issued from the U.S. national phase of PCT application PCT/FI2014/050826, which claimed priority of Finnish applications Nos. 20130320 of Nov. 4, 2013 and 20136170 of Nov. 22, 2013, each of which applications is incorporated by reference herein.*

TECHNICAL FIELD

The invention is related to semiconductor radiation detectors and particularly to semiconductor radiation detectors having a modified internal gate. A radiation detector is hereby defined as a device detecting photons, and/or high energy charged or neutral particles.

BACKGROUND OF THE INVENTION

The patents U.S. Pat. No. 7,816,653, U.S. Pat. No. 8,148,760, and U.S. Pat. No. 8,288,837, which are incorporated herein by reference, disclose a semiconductor radiation detector having a so-called Modified Internal Gate (MIG). The MIG is an internal part of the semiconductor radiation detection, in which radiation-induced signal charges are collected so that the resulting net electric charge in the MIG causes measurable effects in the electric characteristics of pixels above it. Examples of such effects are changes in the current-carrying capability of the channel or base of a pixel-specific transistor. A barrier layer separates the MIG from said pixels. It constitutes, when appropriately biased, a potential energy barrier that keeps the accumulated signal charges in the MIG layer from mixing with charge carriers in the pixels, such as the charge carriers the flow of which constitutes the electric current through said channel or base. Additional information is also disclosed at the internet pages www.pixpolar.com/technology and www.pixpolar.com/blog as well as at several discussions on the blog www.image-sensors-world.blogspot.com.

In semiconductor radiation detectors the radiation induces electron hole pairs which are separated by an electric field. The charge type of the electron hole pair that is measured is referred to as signal charge and the opposite charge type is referred to as secondary charge.

The MIG detectors comprising typically a matrix of MIG pixels have several benefits over traditional radiation detectors like Complementary Metal Oxide Semiconductor (CMOS) image sensors. First of all, in the MIG pixel the interface generated charges do not mix with signal charges. Second, a buried channel having a large potential difference between the bottom of the channel and the interface can be utilized enabling considerable reduction in 1/f noise. Such a low 1/f noise buried channel results in much lower read noise. Third, Back-Side Illuminated (BSI) MIG pixels having 100% fill-factor can be easily designed. Fourth, it is easy to design fully depleted MIG pixels avoiding the diffusion of signal charges which enables very low cross-talk between pixels. Fifth, the MIG pixels comprise inherently a vertical anti-blooming mechanism meaning that blooming is not an issue. Sixth, thick fully depleted MIG pixels enable very good quantum efficiency for red and Near Infra-Red (NIR) light while cross-talk is kept at minimum level. Seventh, the signal charges are well aligned with the lowest channel threshold of the above lying readout transistor. Eighth, the MIG pixels enable linear current mode readout.

The ninth advantage is that the MIG pixels are very much compatible with analog CMOS processes. The reason for this is that leakage through the gate oxide is not an issue since the signal charge is not brought to the external gate. Another reason is that a pinned photo-diode is not required like in traditional CMOS image sensors. The pinned photo-diode is difficult to design and it is actually an adaptation from Charge Coupled Devices (CCD) and it is not inherently present in a standard CMOS process. Also the interface quality is not an issue as it is in traditional CMOS image sensors. The outcome of these facts is that one has to develop a separate CMOS image sensor process for the production of traditional CMOS image sensors whereas an existing standard analog CMOS process can be used for the production of MIG image sensors.

FIG. 1 illustrates a schematic cross-section of a typical CMOS transistor comprising a semiconductor substrate 100 of first or second conductivity type, and on the front side of the device a Shallow-Trench Isolation (STI) 130, gate 181, oxide layer (or more generally a layer of electrically insulating material) 171 surrounding the gate, and a well doping 105 of first conductivity type. In addition the CMOS transistor comprises on the front surface a source doping 111, a drain doping 112, a source contact doping 121, and a drain contact doping 122, which are all of second conductivity type.

Doped regions are physical entities, while the term pixel is more like a functional element, which means that—at least literally taken—pixels only appear in a semiconductor radiation detector when the power is on. Although separate contact dopings like the ones illustrated in FIG. 1 as 121 and 122 are often used, they are not essential. It is possible to create a pixel-specific field-effect transistor in a CMOS process so that the source and drain dopings appear as such, without separate contact dopings. In this description we use the general designation pixel dopings to mean doped regions to which an external voltage and/or current can be directly coupled to create a pixel of the semiconductor radiation detector. Thus in a structure like that in FIG. 1 the pixel dopings are the source contact doping 121 and the drain contact doping 122. In a structure without separate contact dopings the term pixel dopings would refer to the source and drain dopings.

The first and second conductivity types correspond to n and p type or vice versa. In addition, in FIG. 1 also is depicted another CMOS transistor of the same conductivity type having source 113, drain 114, source contact doping 123, drain contact doping 124, and gate 182. Also part of the source contact doping 127 and drain contact doping 128 of two neighboring pixels are depicted in FIG. 1.

FIG. 4 illustrates the schematic front side layout of a CMOS transistor wherein a cross-section along the line 493 corresponds to the cross-section presented in FIG. 1. The first type contact doping 405 is a contact doping to the first type well doping 105. The buried channel MIG pixel is formed by providing underneath the gate of a CMOS transistor a layered structure. The well doping 105 prevents the proper formation of the layered structure underneath the external gates of the transistors in FIG. 1 due to the fact that the dopant concentration of the well doping is typically much higher than the optimal dopant concentration of the layered structure. Thus an opening in the well doping 105 must be provided underneath the external gate 181.

FIG. 5 illustrates a schematic front side layout of a most basic buried channel MIG pixel manufactured with a CMOS process. The opening in the well doping 594 located partly underneath the gate area is depicted by a dashed line. The cross-section along the line 593 is presented in FIG. 2, wherein the well doping 205 comprises openings underneath the external gates 181 and 182. In the opening the MIG layer 241 acts as an internal gate collecting the signal charges which modulate the current running in the buried channel 261 of the above lying readout transistor. The barrier layer 251 acts as a barrier in between the MIG layer and the buried channel. In FIG. 2 there is also depicted the MIG layer 242, the barrier layer 252, and the buried channel layer 262 of the neighboring pixel. On the back-side of the device there is also an optional conductive back-side layer 200 of the first conductivity type which may be or may not be biased. In operation a reverse bias is applied between the source/drain contact dopings and the well doping and/or the conductive back-side layer.

The buried channel 261, 262 is not mandatory requirement for a MIG detector. A low 1/f noise buried channel offers, however, a considerable benefit for the MIG detector/pixel since it enables a significant reduction in the read noise and involves advantages in manufacturing. The latter fact is because the interface quality is of lesser importance due to the large potential difference between the interface and the channel. Thus a buried channel is an advantageous choice. A very important matter from noise point of view is also that when the pixel is reset one should be able to remove all the signal charges from the MIG layer 241, i.e., after reset the MIG layer should be fully depleted. During readout at the location where the signal charges are stored in the MIG layer the barrier layer should be fully depleted. If this is not the case the signal charges cannot properly modulate the threshold voltage of the channel and/or the current running in the channel meaning that the readout is disabled or at least inaccurate.

The arrangement of the opening 594 in the well doping 205 has been considered as the only reasonable choice for the following self-evident reasons. The fact that the STI and the contact doping are surrounded by the well doping means that the layered structure 241, 251, and 261 can be made thinner, which facilitates the coupling of the signal charges to the channel as well as the scaling of the pixel to smaller pixel sizes. In order to enable further thinning of the layered structure one could think that by arranging the opening of the well doping along the dashed line 295 the layered structure could be made even thinner because the source 213 and drain 214 dopings would be completely surrounded by the well doping 205. From the operation point of view this is, however, not recommendable since the highest threshold voltage or the highest channel resistance would be in the areas of the dashed ellipses 293 and 294 wherein the signal charge of MIG layer would have only very little effect due to the screening of the well doping.

For the above presented reasons the way to construct the opening in the well doping that has been considered the best—or even only—alternative is as depicted in FIGS. 2 and 5. The problem with this arrangement is, however, that in order to create reasonable barrier between the source 111/drain 112 dopings and the MIG layer 241 the barrier layer 251 has to be substantially deeper than the source and drain dopings as is depicted at the locations of the dashed ellipses 291 and 292 in FIG. 2. In other words, one has to take care that the source and drain dopings are not 'eating' too much away of the barrier layer, by utilizing a deep enough layered structure. The fact, however, that the source and drain dopings are relatively heavily doped means that they will also diffuse relatively deep down due to subsequent heat treatments, which again necessitates the use of a relatively deep layered structure which hinders pixel scaling.

In case the external gate 181 of a single MIG pixel has to support three different voltage stages (readout, integration, and reset) the amount of signal charge that can be stored in the MIG layer can be very limited. One easy solution to this problem is that one can add a selection transistor to the source. In this manner one needs to utilize only two different voltages on the external gate 181, namely readout and reset. This improves the storing capacity, also known as the Full Well Capacity (FWC) of the MIG layer.

Another way to improve the FWC as well as the cross-talk is presented in FIG. 3 illustrating more advanced MIG pixels manufactured with a non-standard CMOS process wherein deep trenches isolate each pixel including the substrate 301, 302, 303, and 304. The trenches of FIG. 3 comprise optional pixel-specific walls of electrically insulating material 335, 336, 337, and 338, next to which are optional pixel-specific walls of material 395, 396, 397, and 398 that is beneficially conductive, opaque, and a good reflector. In between the latter walls there is a trench fill 330 which is common to all of the pixels. The fact that the well dopings 305, 306, 307, and 308 in each pixel are isolated means that the reset can be aided by increasing the reverse bias between the well doping and the source/drain dopings. It would actually be enough to separate only rows of pixels with the trenches, but if pixel-specific reset were utilized each pixel would need to be separated by a trench as is depicted in FIG. 3. In case the walls 395, 396, 397, and 398 are conductive, the pixel reset can be still improved by utilizing a simultaneous reset pulse both to the walls 395, 396, 397, and 398 and to the well dopings 305, 306, 307, and 308. In other words, a reset pulse may be simultaneously coupled to the wall 396 and to the corresponding well doping 306, in case a reset will be performed to the pixel comprising the gate 182.

In case e.g. the semiconductor material is silicon, the electrically insulating material 335, 336, 337, and 338 is silicon dioxide, and the first conductivity type is n type and the second conductivity type is p type then it is beneficial to contact the walls 395, 396, 397, and 398 to the respective well dopings 305, 306, 307, and 308. In this manner no bias is required between the walls 395, 396, 397, and 398 and the well dopings 305, 306, 307, and 308 in order to form an accumulation or inversion layer of electrons at the interface between the substrate 301, 302, 303, and 304 and isolator walls 335, 336, 337, and 338. The reason for this is that the positive oxide charge in silicon dioxide is enough to create the accumulation or inversion layer of electrons. The benefit of the accumulation or inversion layer is that at the interfaces of the deep trenches protruding through the well dopings 305, 306, 307, and 308 it inhibits the formation of leakage current which would otherwise mix with the signal charges in the MIG layer (in the pixel of FIG. 2 the trenches do not protrude through the neutral well doping and thus the leakage at the interface of the trench is not an issue, i.e., the interface leakage is collected by source and drain).

In case the substrate material is silicon, the first conductivity type is n type, and the back-side layer 300 is formed of silicon dioxide an accumulation or inversion layer of electrons forms also at the back-side interface between the back-side layer 300 and the substrate 301, 302, 303, and 304 due to the positive oxide charge present in silicon dioxide. The great advantage of the arrangement is that the back-side silicon dioxide layer forms spontaneously on the back-side meaning that after the back-side thinning neither back-side implantation nor back-side laser annealing is required which simplifies processing and reduces back-side originated dark current. One should note, however, that even if the back-side layer 300 is formed spontaneously of silicon dioxide and only a simple trench 330 is used without the additional walls 335, 336, 337, and 338 as well as 395, 396, 397, and 398, the processing is still a demanding task due to the fact that high aspect ratio trenches are required since otherwise the fill-factor would be compromised. Another issue is naturally also that such a process would not be a standard CMOS process.

In the above listed patents (U.S. Pat. No. 7,816,653, U.S. Pat. No. 8,148,760, and U.S. Pat. No. 8,288,837 which are incorporated as reference) different types of reset structures have also been present which enable larger FWC. The problem with these reset structures has been, however, that they typically reduce the fill-factor.

Further, a publication WO 2007/077286 discloses a semiconductor radiation detector for detecting visible light. The semiconductor radiation detector comprises a structure wherein a first contact of a first conductivity type is adapted to collect secondary charges from a bulk layer being of first conductivity type material.

Document U.S. 2009/001435, in turn, discloses a semiconductor radiation detector device, which comprises means for reading signal charge from a modified internal gate layer using a floating gate configuration, in which a gate of a readout transistor floats in respect of said pixel voltage.

SUMMARY OF THE INVENTION

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

According to an aspect of the invention there is provided a semiconductor radiation detector comprising the modified internal gate, in which the layered structure (MIG layer, barrier layer, and possibly the buried channel) can be made thinner facilitating pixel scaling. According to another aspect of the invention there is provided a reset structure which enables 100% fill-factor and which can potentially also be used for charge transfer.

Advantageous objectives of the invention are achieved with a semiconductor radiation detector comprising a semiconductor substrate; a modified internal gate layer of semiconductor of second conductivity type: a barrier layer of semiconductor of first conductivity type; pixel dopings of semiconductor of the second conductivity type, adapted to be coupled to at least one pixel voltage in order to create pixels corresponding to pixel dopings; first conductivity type first contact, said pixel voltage being defined as a potential difference between the pixel doping and the first conductivity type first contact; a main gate, and at least one extra gate horizontally displaced from the main gate.

An insight according to the invention can be utilized to build for example a tri-gate MIG transistor wherein the well doping completely surrounds the source and drain dopings. With the aid of the two extra gates artificial sources and drains can be created beneath the extra gates in order to insure that the highest threshold voltage or resistance of the channel is aligned with the signal charge present in the MIG layer.

In order to provide a reset structure enabling a high FWC without a reduction in the fill-factor a more weakly doped layered structure may be provided underneath a reset gate. Beneficially the reset gate can also be used for transfer of the signal charge.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

Parts of illustrated structures that have similar technical function are marked with the same reference designators throughout the drawings.

DETAILED DESCRIPTION OF EMBODIMENDS OF THE INVENTION

In the following description we make use of certain basic vocabulary of semiconductor radiation detectors in which the amount of radiation-induced signal charge that accumulated within a pixel is detected with one or more pixel-specific transistors. A transistor is a semiconductor device where a region of semiconductor material, called the channel or the base, is located between two electrodes, which are a source and a drain in a field-effect transistor or an emitter and a collector in a bipolar junction transistor. The gate of a field effect transistor is a third electrode that is electrically insulated from the channel, so that the electric potential of the gate in relation to the source and drain (as well as to the bulk or substrate of the semiconductor detector) determines the current-carrying capability of the channel. In order to be called a gate, an electrode of a field-effect transistor must be suitably located in the structure so that the electric field that it induces has a measurable effect on at least part of the channel.

We also make use of a conventional selection concerning the way in which semiconductor radiation detectors are drawn in schematic cross-section representations. The lower edge of a cross section is said to represent the so-called back side of the detector chip, while its so-called front side is found at the top of the cross section. As such, the invention is not in any way bound to the definitions of back side and front side; in general we may say that the MIG-based transistor structures that are described in the following are on one surface, or some surface, of the substrate.

Figure 9:
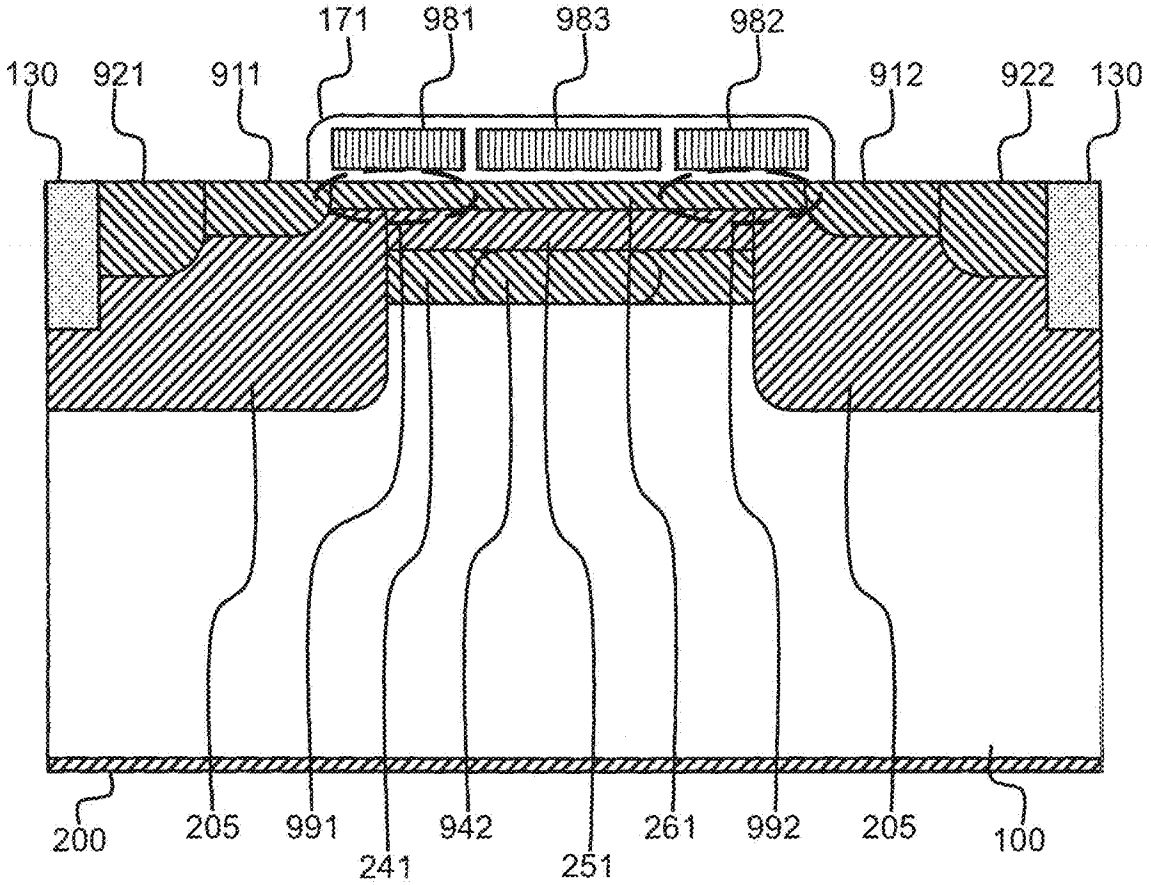
FIG. 9 illustrates a schematic cross-section of an embodiment of the invention comprising a tri-gate buried channel MIG pixel.

FIG. 9 illustrates a schematic cross-section of a back-side illuminated buried channel tri-gate MIG pixel having on the front side a source contact doping 921, a source doping 911, a drain contact doping 922, and a drain doping 912, which are all of the second conductivity type. The contact dopings 921 and 922 are the pixel dopings in this structure according to the designations applied in this text. The MIG layer 241, the barrier layer 251, and the buried channel 261 may resemble the correspondingly numbered parts in the previously described structure of FIG. 2, and the MIG layer 241 could also be called very generally just a first layer of semiconductor material. It should be noted that the designation "first" does not mean first in any arranged order; it is just a name, and a convenient way of referring to the MIG layer.

In addition there is an optional second conductivity type MIG layer enhancement doping 942. It is a region, the net doping of which is higher than the net doping of the remaining MIG layer around that region; the region of higher net doping in the MIG layer is vertically aligned with the gate 983. Enhancement dopings may be present also in the barrier layer 251 and in the buried channel 261; enhancement dopings of this kind could be all implanted with the same mask. In addition one could implant with the same mask also a doping beneath the MIG layer enhancement doping 942, which would be preferably of the first conductivity type. The purpose of the MIG layer enhancement doping 942 is to align the signal charges beneath the main ("external") gate 983. Calling the gate 983 an "external" gate underlines its difference from the MIG layer 241, which constitutes—as its name indicates—an internal gate, or more appropriately a modified internal gate. In order to act as a gate, the main gate 983 is at a location which corresponds at least partly to the location of a channel between the source and the drain of the pixel-specific field-effect transistor.

In the structure of FIG. 9 there are extra gates 981 and 982 on both sides of the main gate 983. An extra gate being on one side of the external gate 983 means that said extra gate is horizontally displaced from the external gate 983. It may be horizontally displaced for example towards the source doping 911 (as the first extra gate 981) or towards the drain doping 912 (as the second extra gate 982), but other directions are possible as well, as will be explained below. Electrically insulating material 171 separates the main gate 983 and the extra gates 981 and 982 from the channel 261, which in this structure goes through a buried channel layer that connects the source 911 and the drain 912 on an opposite side of the barrier layer 251 than the MIG layer 241. In this particular embodiment a common layer of electrically insulating material encapsulates both the main gate 983 and the extra gate(s) 981 and 982, but embodiments could be presented in which each gate electrode had its own electric insulation.

A desirable feature from the operation point of view is that the highest channel threshold voltage and/or the highest channel resistance is beneath the main gate 983 with which the signal charges in the MIG layer are aligned. In order to achieve this goal the extra gates 981 and 982 are most advantageously biased such that threshold voltage and/or channel resistance is much lower beneath the extra gates 981 and 982 than beneath the main gate 983. We may characterize the location of the extra gates so that each extra gate is located above a corresponding MIG border region, at which a part of the channel in the pixel-specific transistor is vertically aligned with an edge of the MIG layer. In this manner an artificial source which is depicted by the dashed ellipse 991 is created beneath the gate 981 and an artificial drain which is depicted by the dashed ellipse 992 is created beneath the gate 982. The designator "artificial" is used here as a reminder of the fact that in the structural division of the transistor into doped regions, the regions illustrated with the ellipses 991 and 992 still belong to the channel, although operationally—taken an appropriate biasing of the external gates 981 and 982—they begin to behave as if they were extensions of the source and the drain respectively. This arrangement enables accurate readout of the signal charge present in the MIG layer.

In FIG. 9 it is assumed that the doping concentration of the second conductivity type buried channel 261 is larger than the doping concentration of the first conductivity type well doping 205 next to the silicon interface. This is naturally not a mandatory condition. Actually the whole buried channel could be omitted but this would naturally increase considerably the 1/f noise.

Figure 10:
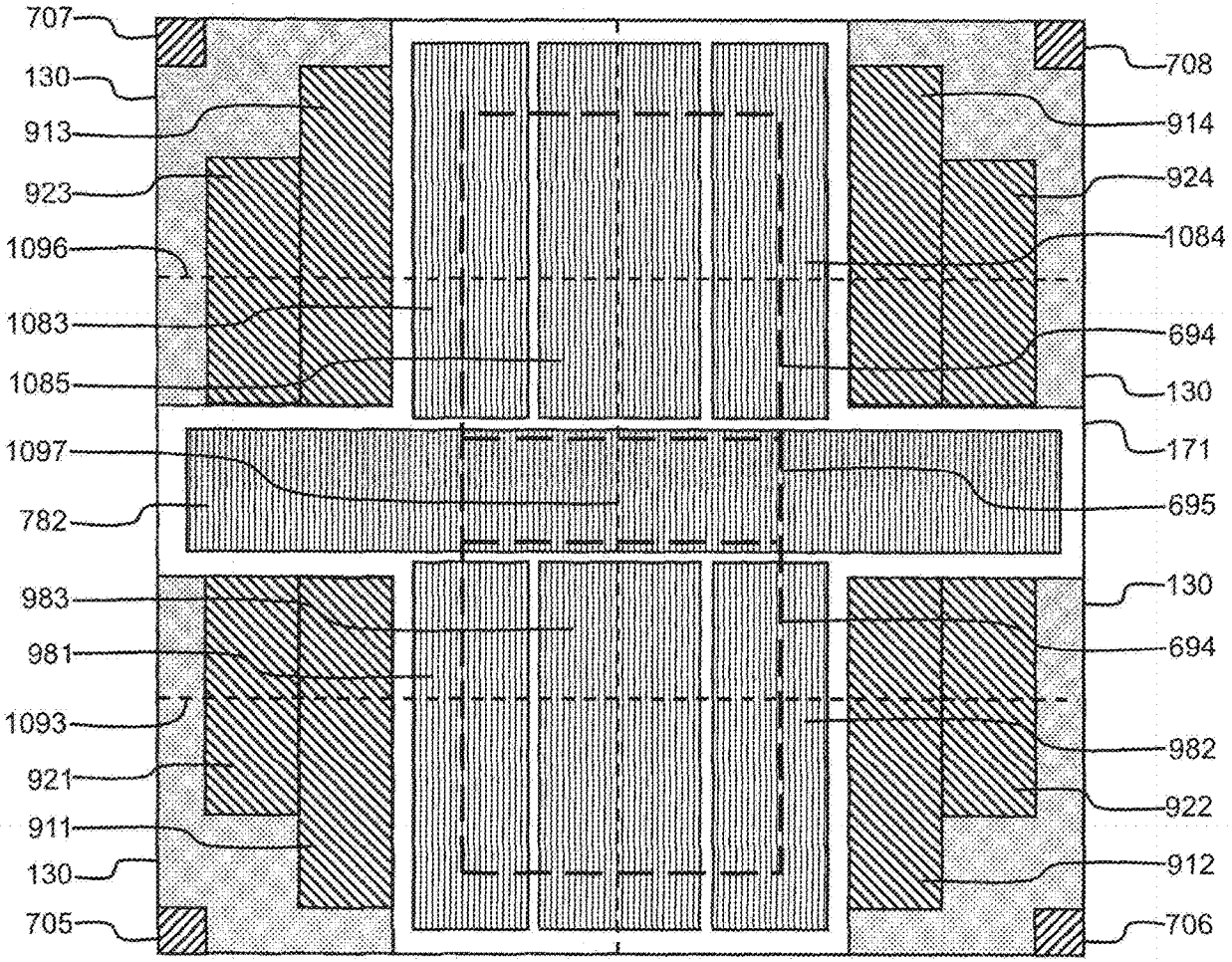
FIG. 10 illustrates a schematic lay-out of an embodiment of the invention wherein a buried channel tri-gate double MIG pixel comprises an extra gate for transfer and reset.

FIG. 10 illustrates a schematic front side lay-out of a back-side illuminated buried channel tri-gate double MIG pixel comprising an extra gate for transfer and reset. The cross-section along the line 1093 corresponds to FIG. 9 and the cross-section along the line 1096 results in a similar cross-section than presented in FIG. 9. The cross-section along the line 1097 resembles considerably the cross-section of FIG. 8 (the only difference is that the enhancement doping of the MIG layer is not presented in FIG. 8). The first type contact dopings 705, 706, 707, and 708 are used to create a contact to the first conductivity type well doping 205. The double MIG pixel comprises also a second field-effect transistor that comprises an additional source doping 913, an additional source contact doping 923, an additional drain doping 914, and an additional drain contact doping 924, which are all of the second conductivity type. In addition there is also another main gate 1085, and two extra gates 1083, 1084 belonging to the upper part of the double MIG pixel. In order to facilitate reset and signal charge transfer between the upper and lower parts of the MIG pixel there is also a transfer and reset gate 782 located above a gap that separates the two field-effect transistors of the pixel.

Figure 8:
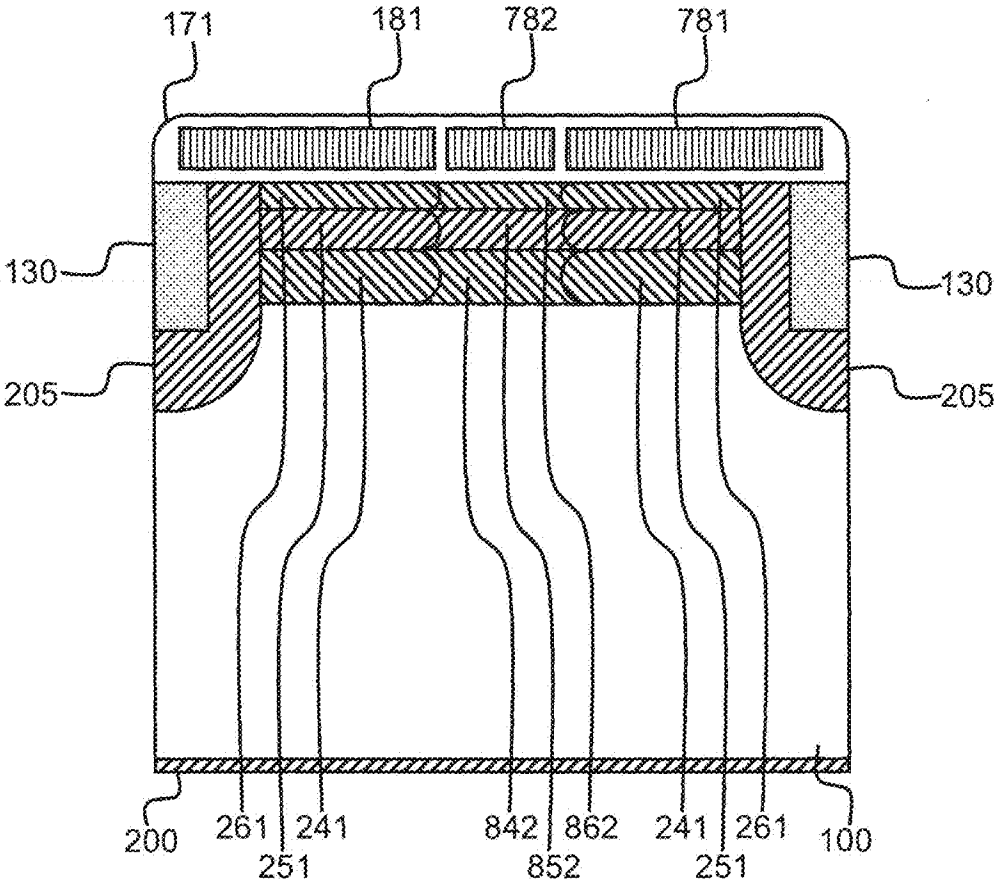
FIG. 8 illustrates a schematic cross-section along the line 796 of the MIG pixel presented in FIG. 7.

The idea behind the double MIG pixel is that the signal charge can be transferred between the two MIGs beneath the main gates 983, 1085 in order to enable Non-Destructive Correlated Double Sampling (NDCDS) readout. The opening of the well doping comprises of three parts: lower one 694, middle one 695, and upper one 694. The reason why the lower and upper parts are similarly numbered as 694 is that the layered structure therein is identical. As depicted in FIG. 8 in the middle part 695 of the opening in the well doping the MIG layer 842, the barrier layer 852, and the buried channel layer 862 have beneficially all weaker doping than the ones in the upper and lower part 694—a matter which facilitates the reset. Another benefit of the arrangement is that when a reset potential is not applied, a barrier is formed in the barrier layer so that the interface leakage current from the depleted interface flows in the buried channel layer towards the source and/or drain dopings and not to the MIG layer. Another feature is that signal charges collected by the MIG layer beneath the transfer and reset gate will flow to the part of the MIG layer situated underneath one of the main gates and not to the buried channel layer. In this manner a 100% fill-factor is maintained while the signal charges are isolated from the interface leakage current which is one of the objectives of the invention. Beneficially the layered structures 842, 852, 862 and 241, 251, 261 are formed with two implant masks; the first mask corresponding to an opening in the resist covering areas 694 and 695 and the second mask corresponding to an opening in the resist covering the two areas marked as 694.

The source and drain contact dopings 921, 923, 922, and 924 may be connected separately to column wise lines, and the gates 782, 981, 982, 983, 1083, 1084, 1085 separately to row wise lines. In case it is assumed that the voltage span is 3.3 V, the first conductivity type is p type, the second conductivity type is n type, and that source current mode readout is utilized, the pixel can be operated for example in the following manner. First the pixel is in integration stage wherein the two main gates 983, 1085 are held at +2.5 V, the extra gates next to the drains 982, 1084 are held at +3.3 V, the extra gates next to the sources 981, 1083 are held e.g. at 0 V (or at +1 V) and the transfer and reset gate 782 is held at 0 V. In general we may say that taken the assumptions above, the following relation holds:

$$V_{rg,i}, V_{es,i} < V_{mg,i} < V_{ed,i}$$

where $V_{rg,i}$ is the electric potential of the reset and transfer gate during integration, $V_{es,i}$ is the electric potential of the source-side extra gate during integration, $V_{mg,i}$ is the electric potential of the main gate during integration, and $V_{ed,i}$ is the electric potential of the drain-side extra gate during integration. Next the signal charges present in the MIG layer of the lower part of the pixel are transferred to the MIG layer of the upper part of the pixel by first connecting e.g. +3.3 V to the source-side extra gate 1083 situated next to the upper main gate 1085, and then +1.5 V to the transfer and reset gate 782. Then the lower main gate 983 and the extra gate next to the drain 982 are connected to 0 V after which the transfer and reset gate is connected back to 0 V. In general we may say that we briefly create the conditions $$V_{mg,tr}, V_{ed,tr} < V_{rg,tr}$$

where $V_{mg,tr}$ is the electric potential of one main gate during transfer, $V_{ed,tr}$ is the electric potential of a corresponding drain-side extra gate during transfer, and $V_{rg,tr}$ is the electric potential of a reset and transfer gate during transfer, and subsequently pull the transfer and reset gate back to a lower potential. This way we make those signal charges, which originally accumulated in the MIG layer beneath that particular main gate, favor migrating horizontally within the MIG layer first beneath the reset and transfer gate and then onwards so that they finally join those signal charges that originally accumulated in the MIG layer beneath the main gate of the other transistor in the pixel.

After this the main gate 983 is connected to +2.5 V and the extra gates 981 and 982 are connected to +3.3 V. More generally the electric potential of the main gate in that transistor, beneath which the MIG layer was just emptied of signal charges, is kept at a lower electric potential than any of the immediately adjacent extra gates, and—if the other transistor in the pixel is read—it is kept also lower than the electric potential of the source-side extra gate of the other transistor in the pixel. The last-mentioned is not mandatory; the other transistor could also be kept closed by keeping said extra gate at a low potential. The purpose is in any case to ensure that the emptied MIG layer beneath said main gate also remains empty for a while. Then a first CDS (Correlated Double Sampling) measurement corresponding to an empty MIG is taken by measuring the source current on source contact doping 921.

After an empty-MIG measurement has been performed in the lower transistor of the pixel, the signal charges are transferred from the upper part of the pixel to the lower part by first connecting +1.5 V to the transfer and reset gate 782. Then the upper main gate 1085 and the upper extra gates 1083, 1084 are connected to 0 V after which the transfer and reset gate 782 is connected back to 0 V. The procedure is a mirror image of that above, where signal charge was first transferred from the MIG layer beneath the lower transistor to that beneath the upper, with the minor exception that the amount of signal charge to move now includes all signal charges that accumulated in the pixel during the preceding integration stage—the first signal charge transfer explained above only moved those signal charges that originally accumulated beneath one transistor.

Next the upper main gate 1085 is connected back to +2.5 V and the upper extra gates 1083, 1084 are connected to +3.3 V. Then a second CDS measurement corresponding to the total amount of signal charge present in the pixel is taken by measuring the source current on the source contact doping 921. Simultaneously a first CDS measurement can be made on the upper source contact doping 923. The final CDS readout result on source contact doping 921 is obtained by subtracting the second CDS readout result from the first CDS result.

In case the signal charges are further transferred from the lower part of pixel to the upper part of the pixel one can obtain another CDS readout result. Beneficially, the CDS readout results from the lower and upper part of the pixel are obtained with different gain settings so that two readout results with different sensitivity (ISO value; the acronym ISO comes from the International Organization for Standardization) settings can be provided. By performing multiple such NDCDS readouts one can naturally obtain several readout results that correspond to different ISO settings.

It should be noted that during the charge transfer state the main gate and the extra gates next to may be first connected to 0 V, after which the transfer and reset gate is shortly biased to +1.5 V and back to 0 V before said main gate is brought to +2.5 V and said extra gates are brought to +3.3 V. It should also be noted that the transfer procedures explained here are only examples, and after having read the explanation the person skilled in the art is capable of presenting other procedures where the idea is simply to control the movements of the collected signal charges with suitable potentials of the main gates, extra gates, as well as the transfer and reset gate.

The extra gates are available as very practical selection means: as was briefly suggested earlier, any transistor in any pixel can be kept closed by keeping an extra gate in such transistor at an electric potential (for example: at a sufficiently low electric potential) that causes the channel in said transistor to remain closed. Thus using the extra gates appropriately may enable leaving out pixel-specific selection transistors, which simplifies the structure of the detector.

The reset of the pixel is performed by connecting +0 V to the main gates 983, 1085 as well as to the extra gates 981, 982, 1083, 1084 and by connecting +3.3 V (or e.g. +2.8 V) to the transfer and reset gate 782. In general we may characterize the reset stage so that the electric potential of the reset (and transfer) gate is made so high in relation to the electric potentials of all other gates in the pixel that the resulting electric fields inside the semiconductor material is sufficient to drive all previously accumulated signal charges out of the MIG layer beneath the whole pixel.

One should note that it is also possible to readout two different rows simultaneously for example in source current readout mode by having e.g. the upper extra gate 1083 next to source closed (e.g. at 0 V) in a lower row and the lower extra gate 981 next to source closed in a upper row throughout the readout procedure of the two rows. The same applies also to source follower readout mode. In case drain current readout mode is used then afore described procedure can be utilized for the gates 982 and 1084 (instead of 981 and 1083).

Figure 11:
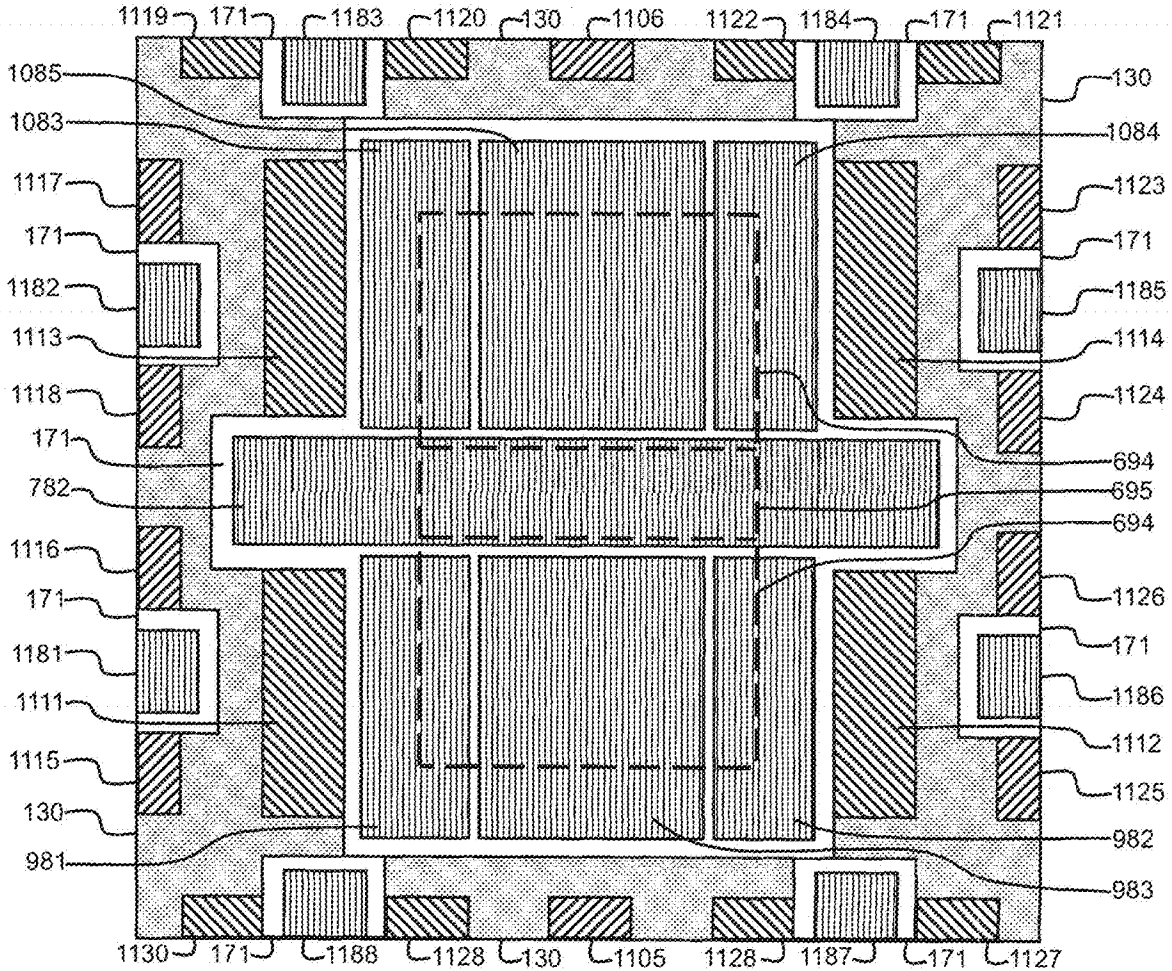
FIG. 11 illustrates a schematic lay-out of an embodiment of the invention wherein a buried channel tri-gate double MIG pixel comprises an extra gate for transfer and reset as well as four additional selection transistors.

FIG. 11 illustrates a schematic front side lay-out of a back-side illuminated buried channel triple gate double MIG pixel having a transfer and reset gate as well as four additional selection transistors per pixel. The first conductivity type contact dopings 1105, 1106 connect to the first type well doping. In this design it is assumed that the pair of mutually adjacent source and source contact dopings, which was illustrated e.g. with reference numbers 911 and 921 in FIG. 10, is replaced with a single source doping: see for example the source dopings 1111 and 1113. Similarly a previously described pair of mutually adjacent drain and drain contact dopings is replaced with a single drain doping, like drain dopings 1112 and 1114. The source and drain dopings in FIG. 11 are referred to as pixel dopings in this structure, because separate contact dopings are not present. Similarly there is only one source doping 1115, 1117, 1119, 1121, 1123, 1125, 1127, and 1129 as well as one drain doping 1116, 1118, 1120, 1122, 1124, 1126, 1128, and 1130 in the selection transistors having minimum sized gates 1181, 1182, 1183, 1184, 1185, 1186, 1187, and 1188.

It is important to note that the doping configuration beneath the gates of the pixel-specific selection transistors may be different. For example the pixel-specific selection transistors may have a doping configuration underneath the gate comprising any combination of the following:

first conductivity type well doping 205 (in case the well is not present underneath the gate there must be an opening in the well doping), layered structure 241, 251, 261 (see FIG. 2), and layered structure 842, 852, 862 (see FIG. 8).

In this manner one can adjust the threshold voltages of individual selection transistors according to specific needs. In other words, one pixel may comprise at least two selection transistors which have different threshold voltages. For example if the drains of the selection transistors are connected to the extra gates it would be beneficial to have an as small threshold voltage as possible since this facilitates the formation of the artificial source and drain beneath the extra gates. It is also beneficial to make the well extend beneath the selection transistors, since this way there is no risk that signal charges would be inadvertently collected in the MIG layer beneath the selection transistors where they would be of no use to any measurement.

The pixel of FIG. 11 is operated in the similar manner than the pixel of FIG. 10. The only difference is that the selection transistors enable pixel-specific reset. In the most simple configuration the drains of two pixel-specific selection transistors are connected separately to the transfer and reset gate 782 as well as e.g. to the upper main gate 1085. In another pixel-specific reset arrangement also the gate of the lower main gate 983 is connected to the drain of a selection transistor. Besides also more elaborate pixel-specific reset schemes may be used wherein all four selection transistors are involved. In pixel-specific reset the gates of selection transistors should be connected separately or non-separately column wise whereas the sources of the pixel-specific selection transistors should be connected separately row wise. The sources 1111, 1113 and drains 1112, 1114 of the actual tri-gate MIG transistors should be connected column wise on separate lines and all the gates of the actual tri-gate MIG transistors that are not connected to a selection transistor should be connected separately row wise. In this manner column wise electronics can decide whether to perform pixel-specific reset (for example when the amount of signal charge is 50% of the NDCDS FWC) by connecting 0 V to the column wise selection transistor gates before 0 V is connected to the main and extra gates and +3.3 V is connected to the transfer and reset gate line.

Figure 7:
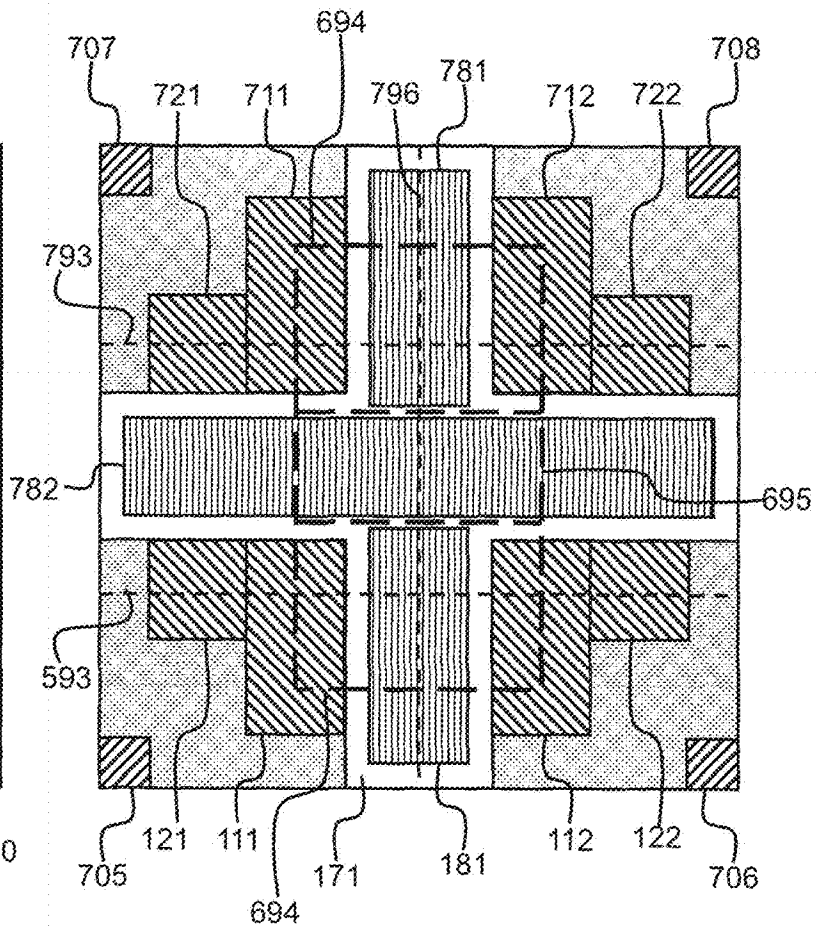
FIG. 7 illustrates a schematic lay-out of an embodiment of the invention wherein a buried channel double MIG pixel comprises an extra gate for transfer and reset.

FIG. 7 illustrates a front side schematic layout of a back-side illuminated buried channel double MIG pixel enabling NDCDS readout. In the pixel of FIG. 7 the extra gates in the tri-gate structure of FIG. 10 are removed but the transfer and reset gate is preserved, and appears in the middle of the drawing with the reference designator 782. A cross-section along the line 593 corresponds to FIG. 2 and a cross-section along the line 793 corresponds to a similar cross-section as presented in FIG. 2. The cross-section along the line 796 corresponds, on the other hand, to FIG. 8. In FIG. 7 the source doping 711, the source contact doping 721, the drain doping 712, and the drain contact doping 722 in the upper part of the pixel are all of the second conductivity type. The source contact doping 721 and the drain contact doping 722 are referred to as pixel dopings. The operation of the gate 181 in the lower part of the pixel and the gate 781 in the upper part of the pixel have the difference when compared to the operation of the main gates in FIGS. 10 and 11 that an integration voltage needs to be utilized unless selection transistors are provided e.g. for the source contact dopings 121, 721. Otherwise the operation is very much similar to the pixel of FIG. 10. A feature in the pixel of FIG. 7 that makes a significant difference to all prior art arrangements is the transfer and reset gate arrangement having underneath it a less doped layered structure than underneath the actual gates 181, 781; see the less doped layered structure referred to with reference designators 842, 852, and 862 in FIG. 8.

Figure 1:
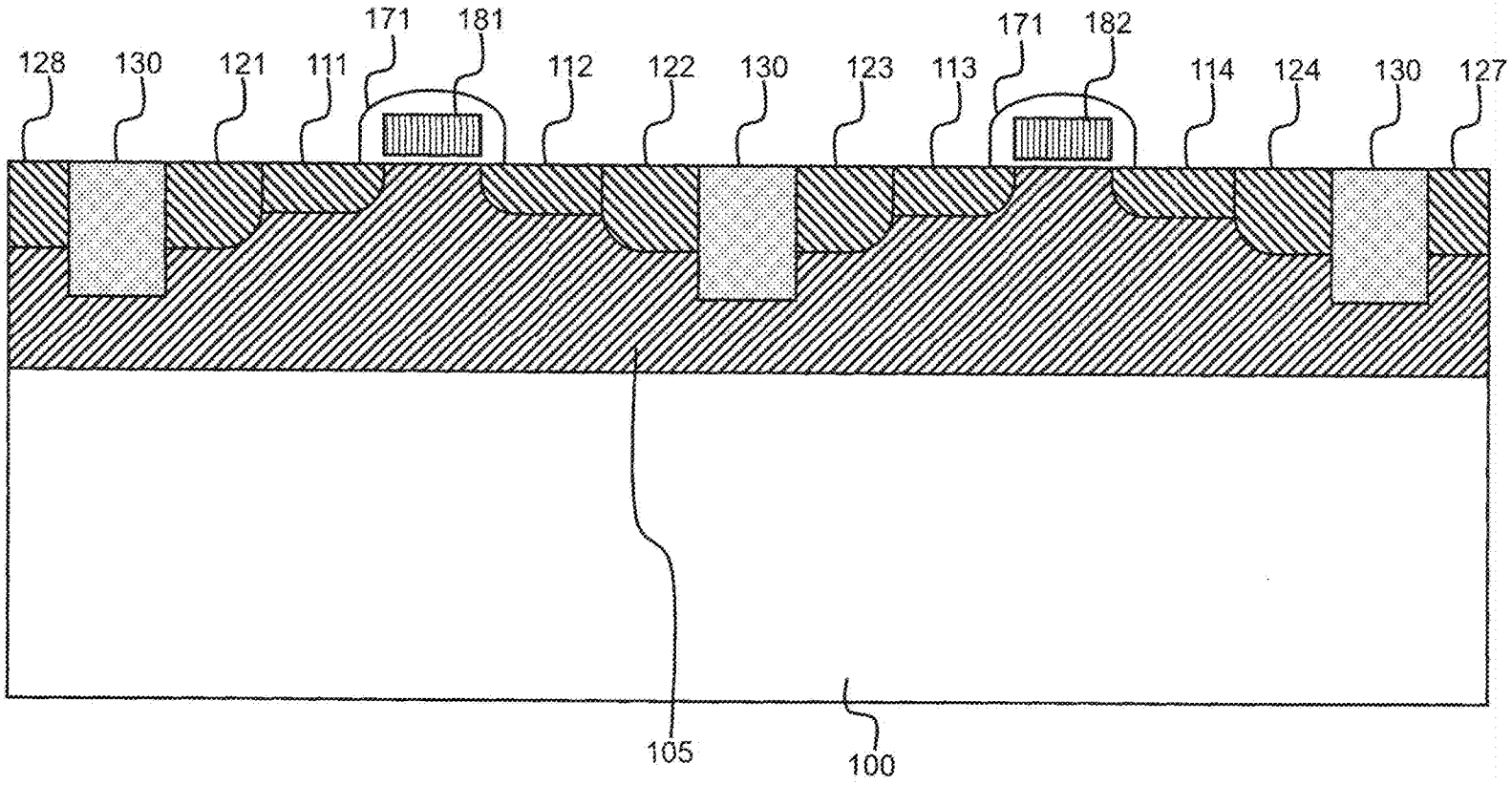
FIG. 1 illustrates a schematic cross-section of typical CMOS transistors.
Figure 2:
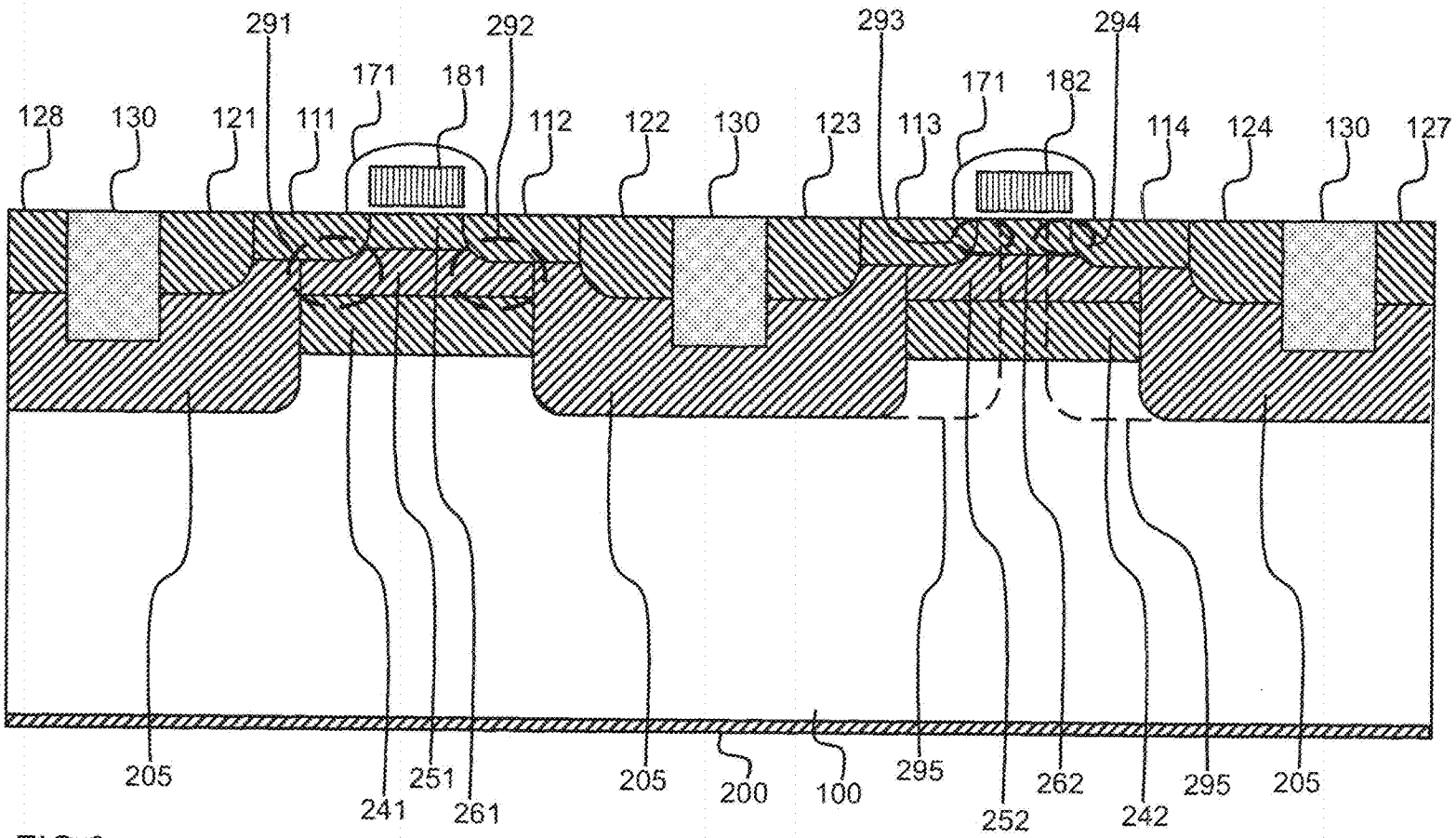
FIG. 2 illustrates a schematic cross-section of a most basic buried channel MIG pixel manufactured with a standard CMOS process.
Figure 3:
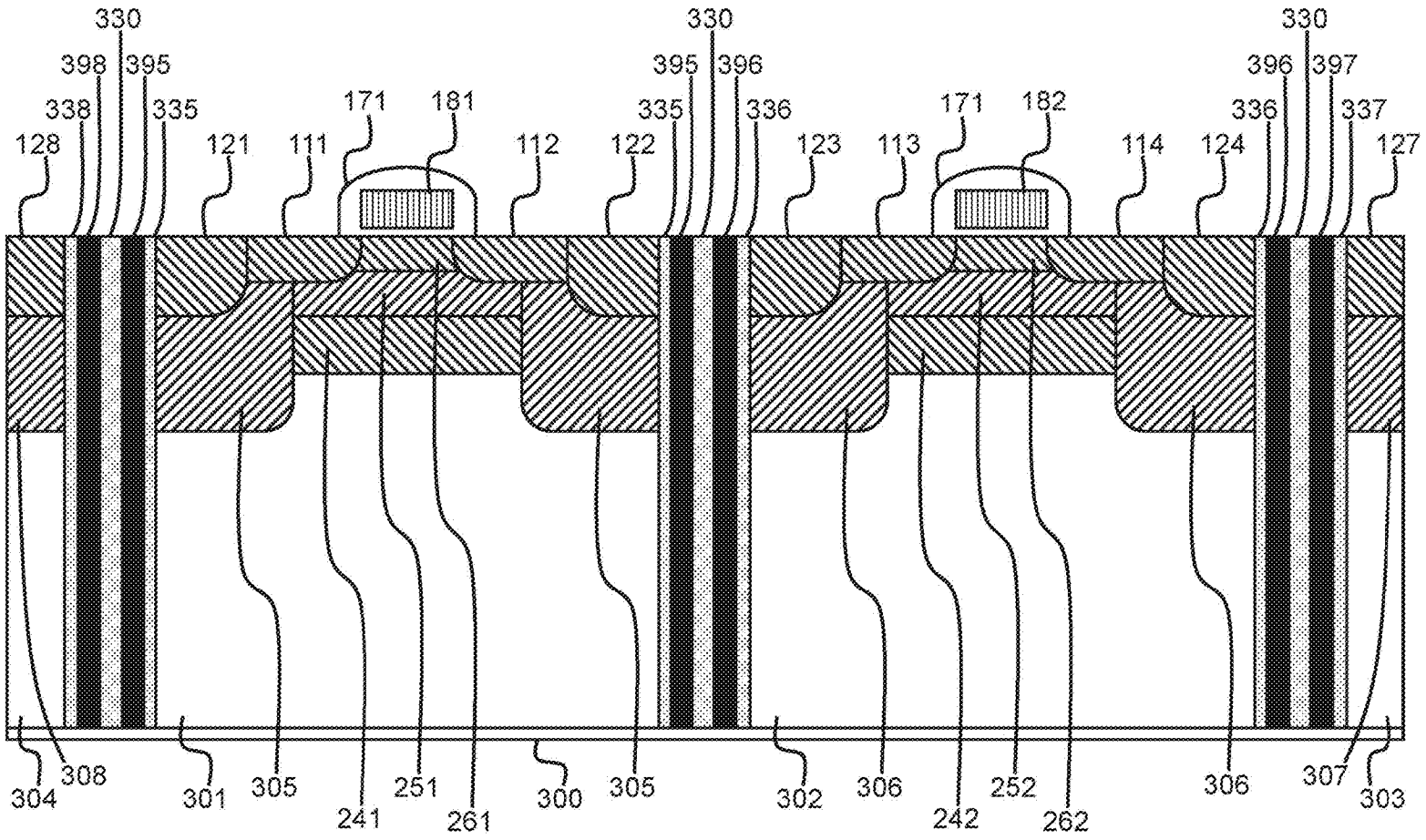
FIG. 3 illustrates a schematic cross-section of a more advanced buried channel MIG pixel manufactured with a non-standard CMOS process.
Figure 5:
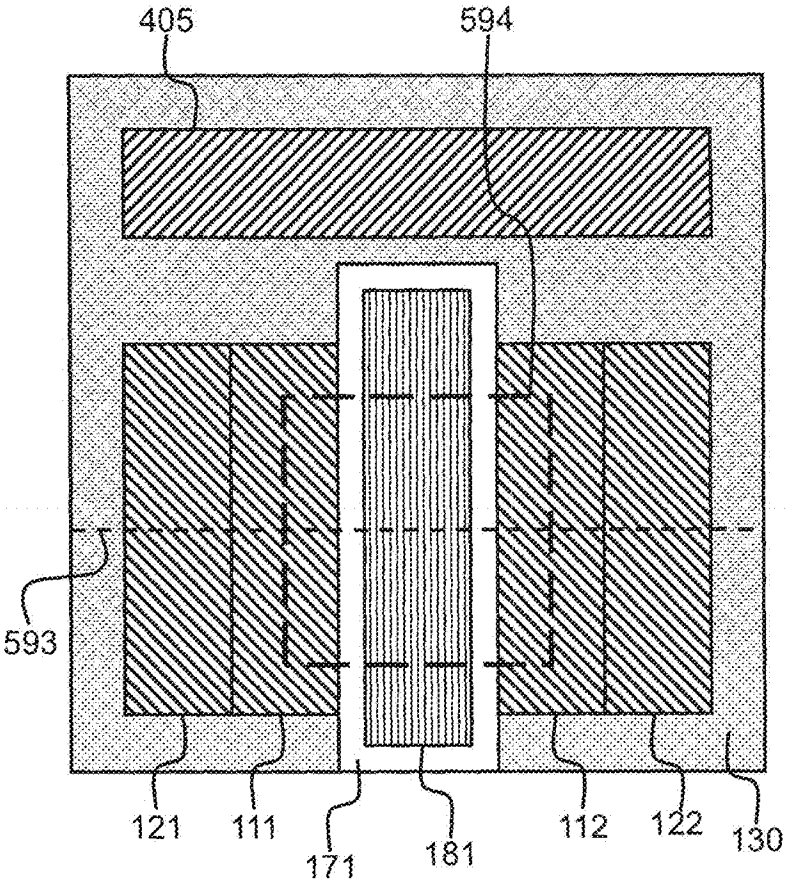
FIG. 5 illustrates a schematic lay-out of the most basic buried channel MIG pixel manufactured with a standard CMOS process.
Figure 4:
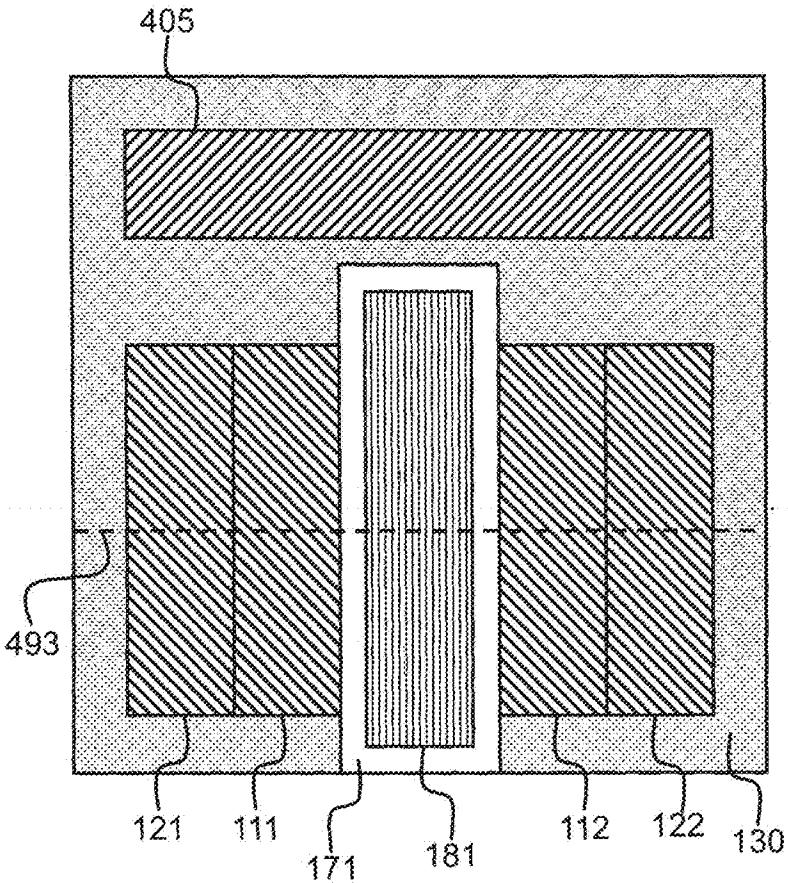
FIG. 4 illustrates a schematic lay-out of the typical CMOS transistor of FIG. 1.
Figure 6:
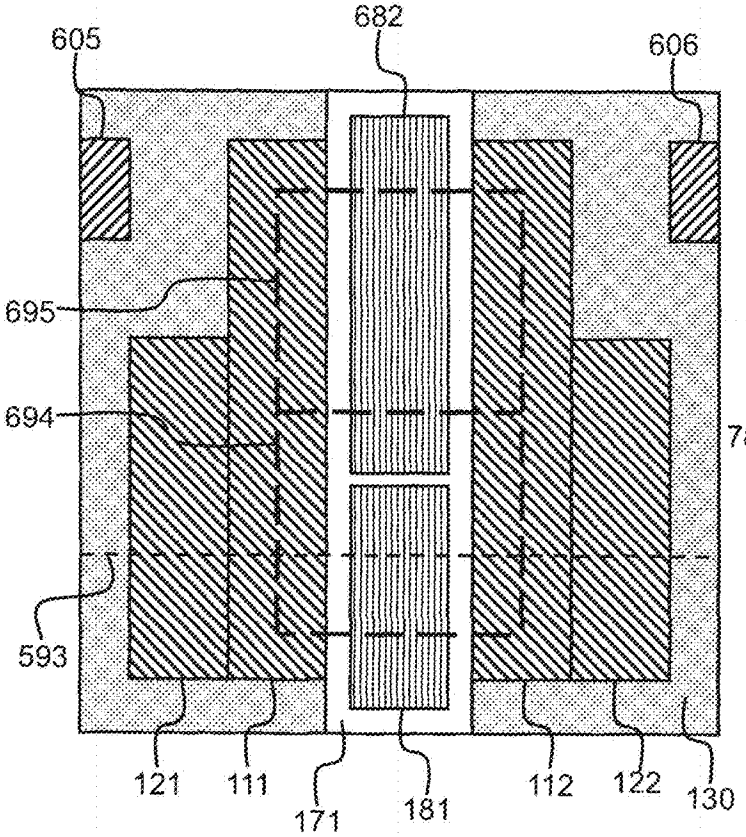
FIG. 6 illustrates a schematic lay-out of an embodiment of the invention comprising a buried channel MIG pixel having an extra reset gate.

FIG. 6 illustrates a schematic front side layout of a back-side illuminated buried channel MIG pixel wherein the cross-section along the line 593 corresponds to FIG. 2. The first conductivity type contact dopings 605, 606 form a contact to the underneath lying first type well doping. In this case the reset gate 682 is utilized solely for reset. It is horizontally displaced from the main gate 181, so that both the reset gate 682 and the main gate 181 are located above a gap that separates the source 111 and the drain 112. The layered structure underneath the reset gate 682 is, however, similar as beneath the gates 782 of FIGS. 7, 10, and 11, i.e., the doping concentrations of the layers in the layered structure beneath the reset gate 682 are smaller than in the layers of the layered structure beneath the actual gate 181. This difference is illustrated in FIG. 6 with the dashed rectangles referred to as 694 and 695 in the same way as in FIGS. 7, 10, and 11.

Proper MIG detector/pixel operation necessitates that a reverse bias is applied between the pixel dopings and a first conductivity type first contact which can be first conductivity type contact doping to the well doping (707, 1105), a first conductivity type contact doping contacting an optional first conductivity type backside conductive layer (200), or a first conductivity type contact to a backside first conductivity type accumulation or inversion layer.

Variations and modifications to the exemplary embodiments illustrated so far are possible without parting from the scope of protection defined by the appended claims. In the following we present some examples.

Even if the structures described so far have the extra gates on both sides of the main gate, it is possible to reap at least some of the same advantages by using an extra gate only on the source side or only on the drain side of the main gate. An asymmetric embodiment, in which only one extra gate is used, requires proper relations between the source, drain, and gate potentials that take the asymmetry into account.

Even if the lay-out drawings illustrate the various doping patterns as rectangles, this is only a matter of graphical clarity; it is perfectly possible to utilize the same principles in structures where doping areas have some other shapes, like hexagonal shapes for example. Also mixed embodiments are possible where some of the doping patterns are rectangular while others are triangular, curved, and/or polygonal.

Local variations in the net effective doping of the described layers, like local variations in the net doping of the MIG layer, are possible at various locations and they can be used to shape the electric fields that control the flow of the signal charges within the structure.

It is possible to replace at least some of the planar, essentially two-dimensional layered structures discussed so far with three-dimensional structures, where the three-dimensionality means that some structure has functionally significant changes in its horizontal dimensions at various depths.

Instead of a source current mode readout, other readout mechanisms such as drain current readout and source follower readout can be utilized.

The substrate can be of either conductivity type.

The number of masks used to create the implanted patterns is not limited by the invention. In the description above we have pointed out that for example the doping enhancements in a number of stacked layers may be produced with the same mask, but different masks could also be used.

A buried channel improves the operation of the artificial source and drain, since the gaps between the main gate and the extra gates can be larger than if no buried channel is used. The reason for this is that in case there is a buried channel, the threshold voltage beneath the gap is smaller than directly beneath the gates. If the buried channel was missing, the threshold voltage beneath the gaps would be larger than beneath the gates.

The invention claimed is:

[1. A semiconductor radiation detector device comprising at least one pixel, wherein the at least one pixel comprises a semiconductor substrate (100) and on one surface of the substrate in the following order:

a first layer (241) of semiconductor of second conductivity type, hereinafter the MIG layer, a barrier layer (251) of semiconductor of first conductivity type, configured to form a potential energy barrier for signal charges accumulated in said MIG layer during operation of the device, pixel dopings (921, 922, 1111, 1112, 121, 122) of semiconductor of the second conductivity type, which pixel dopings are adapted to be coupled to at least one pixel voltage in order to create a source and a drain of a pixel-specific transistor;

wherein the device further comprises a first conductivity type first contact, said pixel voltage being defined as a potential difference between one of the pixel dopings and the first conductivity type first contact, and a main gate (983) the location of which corresponds at least partly to the location of a channel between said source and said drain, wherein:

the at least one pixel further comprises at least one extra gate (981, 982) next to the main gate (983) and the location of the at least one extra gate (981, 982) corresponds at least partly to the location of a channel between said source and said drain and wherein the at least one extra gate (981, 982) is external to said semiconductor material of the first conductivity type and the second conductivity type.]

[2. The semiconductor radiation detector device according to claim 1, comprising two extra gates, the location of a first extra gate is towards said source from the main gate, and the location of the other extra gate is towards said drain from the main gate.]

[3. The semiconductor radiation detector device according to claim 2, wherein each extra gate is located above a corresponding MIG border region at which a part of said channel is vertically aligned with an edge of said MIG layer.]

[4. The semiconductor radiation detector device according to claim 1, wherein each extra gate is located above a corresponding MIG border region at which a part of said channel is vertically aligned with an edge of said MIG layer.]

[5. The semiconductor radiation detector device according to claim 1, wherein said channel goes through a buried channel layer that connects said source and said drain on an opposite side of said barrier layer than said MIG layer.]

[6. The semiconductor radiation detector device according to claim 1, comprising electrically insulating material that separates said main gate and said extra gate or extra gates from said channel.]

[7. The semiconductor radiation detector device according to claim 6, wherein a common layer of electrically insulating material encapsulates both said main gate and said extra gate or extra gates.]

[8. The semiconductor radiation detector device according to claim 1, comprising in said MIG layer a region the net doping of which is higher than the net doping of the remaining MIG layer around said region, wherein said region is vertically aligned with said main gate.]

[9. The semiconductor radiation detector device according to claim 1, comprising a reset gate (682, 782) underneath of which the doping of the MIG layer (842) and barrier layer (852) is weaker than underneath the main gate (983).]

[10. The semiconductor radiation detector device according to claim 9, wherein said reset gate (682) is horizontally displaced from said main gate (181), and wherein both said reset gate (682) and said main gate (181) are located above a gap that separates said source (111) and said drain (112).]

[11. The semiconductor radiation detector device according to claim 9, wherein:

said field-effect transistor is a first field-effect transistor of a pixel in the device, which pixel comprises also a second field-effect transistor that comprises a second source and a second drain, said reset gate is simultaneously a transfer gate that is located above a gap that separates the field-effect transistors of the pixel.]

[12. The semiconductor radiation detector device according to claim 1, comprising at least two pixel-specific selection transistors which have different threshold voltages.]

*13. A semiconductor radiation detector device comprising at least one pixel, wherein the at least one pixel comprises a semiconductor substrate and on one surface of the substrate in the following order:*

*a first layer of semiconductor of second conductivity type, hereinafter the MIG layer,*

*a barrier layer of semiconductor of first conductivity type, configured to form a potential energy barrier for signal charges accumulated in said MIG layer during operation of the device,*

*pixel dopings of semiconductor of the second conductivity type, which pixel dopings are adapted to be coupled to at least one pixel voltage in order to create a source and a drain of a pixel-specific transistor;*

*wherein the device further comprises a first conductivity type first contact, said. pixel voltage being defined as a potential difference between one of the pixel dopings and the first conductivity type first contact, and a main gate the location of which corresponds at least partly to the location of a channel between said source and said drain,*

*wherein:*

*the at least one pixel further comprises at least one extra gate next to the main gate and the location of the at least one extra gate corresponds at least partly to the location of a channel between said source and said drain and wherein the at least one extra gate is external to said semiconductor material of the first conductivity type and the second conductivity type,*

*comprising in said MIG layer a region the net doping of which is higher than the net doping of the remaining MIG layer around said region, wherein said region is vertically aligned with said main gate,*

*comprising a reset gate underneath of which the doping of the MIG layer and barrier layer is weaker than underneath the main gate.*

*14. The semiconductor radiation detector device according to claim 13, comprising two extra gates, the location of a first extra gate is towards said source from the main gate, and the location of the other extra gate is towards said drain from the main gate.*

*15. The semiconductor radiation detector device according to claim 14, wherein each extra gate is located above a corresponding MIG border region at which a part of said channel is vertically aligned with an edge of said MIG layer.*

*16. The semiconductor radiation detector device according to claim 13, comprising electrically insulating material that separates said main gate and said extra gate or extra gates from said channel.*

*17. The semiconductor radiation detector device according to claim 16, wherein a common layer of electrically insulating material encapsulates both said main gate and said extra gate or extra gates.*

*18. The semiconductor radiation detector device according to claim 13, wherein said reset gate is horizontally displaced from said main gate, and wherein both said reset gate and said main gate are located above a gap that separates said source and said drain.*

*19. The semiconductor radiation detector device according to claim 13, wherein:*

*said field-effect transistor is a first field-effect transistor of a pixel in the device, which pixel comprises also a second field-effect transistor that comprises a second source and a second drain,*

*said reset gate is simultaneously a transfer gate that is located above a gap that separates the field-effect transistors of the pixel.*

*20. The semiconductor radiation detector device according to claim 13, wherein each extra gate is located above a corresponding MTG border region at which a part of said channel is vertically aligned with an edge of said MTG layer.*

*21. The semiconductor radiation detector device according to claim 13, wherein said channel goes through a buried channel layer that connects said source and said drain on an opposite side of said barrier layer than said MIG layer.*

*22. The semiconductor radiation detector device according to claim 13, comprising at least two pixel-specific selection transistors which have different threshold voltages.*

*23. A semiconductor radiation detector device comprising at least one pixel, wherein the at least one pixel comprises a semiconductor substrate (100) and on one surface of the substrate the semiconductor radiation detector comprises:*

*a first conductivity type well doping (205),*

*a second conductivity type source doping (911, 1111) and a second conductivity type drain doping (912, 1112) inside said first conductivity type well doping (205),*

*an opening in the first conductivity type well doping (205) located in between said source doping (911, 1111) and said drain doping (912, 1112),*

*a first layer (241) of semiconductor of second conductivity type, hereinafter the MIG layer, said MIG layer located in said opening of the first conductivity type well doping,*

*a barrier layer (251) of a semiconductor of first conductivity type arranged directly on the MIG layer in between the MIG layer and said one surface of the substrate and located in said opening of the first conductivity type well doping, said barrier layer configured to form a potential energy barrier for signal charges accumulated in said MIG layer during operation of the semiconductor radiation detector device,*

*a main gate (983) external to the semiconductor substrate and located in between said source doping (911, 1111) and said drain doping (912, 1112) as well as above said barrier layer on said opening in the first conductivity type well doping,*

*a channel between said source and said drain, wherein part of said channel is located underneath said main gate in said opening in the first conductivity type well doping, said channel carrying charges of said second conductivity type,*

*wherein:*

*the at least one pixel further comprises at least one extra gate (981, 982) external to the semiconductor substrate and located in between the main gate (983) and the second conductivity type source doping (911, 1111) or drain doping (912, 1112) wherein the at least one extra gate (981, 982) is located above a boundary of said well doping and said opening, and wherein the at least one extra gate (981, 982) is adapted to be coupled to a potential such that the channel resistance is lower beneath the at least one extra gate than beneath the main gate such as to create inside the semiconductor substrate underneath the extra gate:*

*an artificial source if the extra gate (981) is located in between the second conductivity type source doping (911, 1111) and the main gate (983), or*

*an artificial drain if the extra gate (982) is located in between the second conductivity type drain doping (912, 1112) and the main gate (983).*

*24. The semiconductor radiation detector device according to claim 23, wherein the semiconductor radiation detector device comprises two extra gates (981, 982), the location of a first extra gate (981) is in between the second conductivity type source doping (911, 1111) and the main gate (983), and the location of the other extra gate (982) is in between the second conductivity type drain doping (912, 1112) and the main gate (983).*

* * * * *